US012736884B2

(12) United States Patent
Zijp

(10) Patent No.: US 12,736,884 B2
(45) Date of Patent: Sep. 15, 2026

(54) ASSEMBLY FOR A LASER-OPERATED LIGHT SOURCE AND METHOD OF USE

(71) Applicant: ASML NETHERLANDS B.V., Veldhoven (NL)

(72) Inventor: Ferry Zijp, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 175 days.

(21) Appl. No.: 18/714,411

(22) PCT Filed: Nov. 22, 2022

(86) PCT No.: PCT/EP2022/082821
§ 371 (c)(1),
(2) Date: May 29, 2024

(87) PCT Pub. No.: WO2023/117265
PCT Pub. Date: Jun. 29, 2023

(65) Prior Publication Data

US 2025/0021009 A1 Jan. 16, 2025

(30) Foreign Application Priority Data

Dec. 23, 2021 (EP) .................................... 21217334

(51) Int. Cl.
*G03F 7/00* (2006.01)
*G03F 7/20* (2006.01)
(Continued)

(52) U.S. Cl.
CPC ........ *G03F 7/70233* (2013.01); *G03F 7/2004* (2013.01); *G03F 7/70033* (2013.01);
(Continued)

(58) Field of Classification Search
CPC ............... G03F 7/70233; G03F 7/2004; G03F 7/70033; G03F 7/706847; G03F 7/706849;
(Continued)

(56) References Cited

U.S. PATENT DOCUMENTS 6,952,253 B2 10/2005 Lof et al.
10,770,282 B1 9/2020 Abramenko et al.
(Continued)

OTHER PUBLICATIONS

International Search Report and Written Opinion issued in corresponding PCT Patent Application No. PCT/EP2022/082821, dated Mar. 1, 2023.

*Primary Examiner* — Hung V Nguyen
(74) *Attorney, Agent, or Firm* — Pillsbury Winthrop Shaw Pittman, LLP

(57) ABSTRACT

An optical assembly includes a bulb and a lens for a laser-operated light source. The bulb has a chamber for accommodating an ionizable gas and a plasma formed by energizing the ionizable gas and has a longitudinal axis and a transverse axis perpendicular to the longitudinal axis. In use, the lens is arranged to focus a wavefront of radiation from a laser to a virtual object point located inside the chamber. In use, the bulb is arranged to transmit and refract the wavefront of the radiation to a first real image point in a first cross-section of the longitudinal axis and a second real image point in a second cross-section of the transverse axis. The first real image point and the second real image point are image conjugates of the virtual object point. The virtual object point, the first real image point and the second real image point coincide.

20 Claims, 4 Drawing Sheets

(51) Int. Cl.
*H01J 61/16* (2006.01)
*H01J 61/30* (2006.01)
*H01J 61/33* (2006.01)
*H05G 2/00* (2006.01)

(52) U.S. Cl.
CPC .. *G03F 7/706847* (2023.05); *G03F 7/706849* (2023.05); *H01J 61/16* (2013.01); *H01J 61/302* (2013.01); *H01J 61/33* (2013.01); *H05G 2/0086* (2024.08)

(58) Field of Classification Search
CPC .......... H01J 61/16; H01J 61/302; H01J 61/33; H01J 65/042; H01J 61/025; H05G 2/0086
See application file for complete search history.

(56) References Cited

U.S. PATENT DOCUMENTS 11,099,483 B2 * 8/2021 Flagello .............. G03F 7/70033
2014/0367592 A1 12/2014 Bezel et al.
2015/0282288 A1 10/2015 Bezel et al.
2017/0150590 A1 5/2017 Chimmalgi et al.
2017/0278694 A1 * 9/2017 Chuang ................. H01J 61/302
2021/0282256 A1 9/2021 Abramenko et al.

* cited by examiner

ASSEMBLY FOR A LASER-OPERATED LIGHT SOURCE AND METHOD OF USE

CROSS-REFERENCE TO RELATED APPLICATION

The application is the U.S. national phase entry of PCT Patent Application No. PCT/EP2022/082821 which was filed on Nov. 22, 2022, which claims priority of European Patent Application No. 21217334.8 which was filed on Dec. 23, 2021 and which is incorporated herein in its entirety by reference.

FIELD

The present invention relates to an assembly for a laser-operated light source and method of use. In addition, the present invention relates to the laser-operated light source and a method of manufacture of a bulb.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

A Laser-Pumped Plasma Source (LPPS) may be used to produce light (such as UV light) for e.g. a level sensor in a lithographic apparatus or metrology system. For example, the level sensor may be used for measuring a position of a surface of a substrate in the lithographic apparatus.

A LPPS may comprise a lamp bulb that is ignited by electrical discharge and pumped by focusing (using an aspherical focusing lens) a spherical wavefront of a continuous infrared (IR) laser into plasma at the center of the bulb. Both the aspherical focusing lens and the bulb design should introduce minimal optical aberrations to the IR wavefront transmitted through the bulb. Any significant wavefront aberration will increase the focused spot size and reduce the energy density of the focused IR in the plasma. This in turn reduces the brightness and power of the converted light from the LPPS plasma.

It may be desirable to provide methods and apparatus for minimising optical aberrations to the IR wavefront transmitted through the bulb.

SUMMARY

In accordance with a first aspect of the present invention, there is provided an optical assembly comprising a bulb and a lens for a laser-operated light source, wherein the bulb comprises a chamber for accommodating an ionizable gas and a plasma formed by energizing the ionizable gas; wherein, in use, the lens is arranged to focus a wavefront of radiation from a laser to a virtual object point located inside the chamber; wherein the bulb comprises a longitudinal axis and a transverse axis perpendicular to the longitudinal axis, wherein, in use, the bulb is arranged to transmit and refract the wavefront of the radiation to a first real image point in a first cross-section of the longitudinal axis and a second real image point in a second cross-section of the transverse axis, the second cross-section of the transverse axis comprising an outer surface cross-section and an inner surface cross-section, the outer surface cross-section and the inner surface cross-section being concentric, and the first real image point and the second real image point being image conjugates of the virtual object point; and wherein the virtual object point, the first real image point and the second real image point coincide.

The virtual object point, the first real image point and the second real image point coincide so as to reduce or eliminate astigmatism of the focused wavefront on the longitudinal axis.

This has an advantage that the brightness and power of the laser-operated light source is not reduced or is reduced by relatively less (e.g. by a factor of 2).

The virtual object point, the first real image point and the second real image point coinciding may be described as the bulb and the lens together being arranged to transmit and refract a wavefront of radiation to a single focus point in both a first cross-section of a longitudinal axis and a second cross-section of a transverse axis.

The first cross-section of the longitudinal axis is a cross-section taken in a plane along the longitudinal axis.

The first real image point in a first cross-section of the longitudinal axis may also be defined by a first real image point on the longitudinal axis, or a point on a plane in a first cross-section.

The second cross-section of the transverse axis is a cross-section taken in a plane perpendicular to the longitudinal axis.

The second real image point in a second cross-section of the transverse axis may also be defined by a second real image point on the transverse axis, or a point on a plane in a second cross-section.

The transverse axis may be taken along an equator plane of the bulb.

The longitudinal axis and the transverse axis may be taken through the center of the bulb.

The wavefront of the radiation may be a spherical wavefront.

The lens (i.e. focusing lens) arranged to focus the wavefront of the radiation from the laser may be an aspherical lens.

The lens may be arranged to focus the wavefront of the radiation from the laser to the virtual object point located at substantially the center or very close to the center, of the chamber. This may be optimal for reasons of bulb-induced aberrations in the radiation from the laser, and also to minimize aberrations in the broadband light (e.g. UV, VIS and IR) emitted by the plasma.

A side (i.e. one half) of the first cross-section may be considered to be a thick lens. The second cross-section may be considered to be a thick concentric meniscus lens. Paraxial approximation may be used.

The bulb may be considered as a volume of revolution defined by an inner and outer curve that are swept around the longitudinal axis.

The bulb may be considered to act like a toroidal lens with different focal lengths in the first cross-section and the second cross-section.

The ionizable gas may be Xenon.

The bulb may be quartz.

The bulb may comprise a refractive index n, a thickness d of a wall of the bulb at the transverse axis, an outer radius of curvature $r_1$ and an inner radius of curvature $r_2$ of the second cross-section, an outer radius of curvature $R_1$ and an inner radius of curvature $R_2$ of the first cross-section such that the virtual object point, the first real image point and the second real image point coincide.

The bulb may comprise outer radius of curvature $r_1$ and inner radius of curvature $r_2$ of the second cross-section that satisfy the equations: $r_1=\delta-\delta^-$ and $r_2=r_1-d$, where δ is the distance from the first cross-section outer surface vertex to a first principal plane at principal point P of the first cross-section, d is the thickness of wall of the bulb at the transverse axis and $S^-$ is the object distance from the first principal plane and is calculated from $$S^- = \frac{-\Delta \pm \sqrt{\Delta^2 + 4\Delta/K}}{2},$$

where Δ is the distance between the first principal plane and a second principal plane at principal point P' of the first cross-section, and K is the power of the first cross-section.

The negative solution $S^-$ is the solution from $$S^{\pm} = \frac{-\Delta \pm \sqrt{\Delta^2 + 4\Delta/K}}{2}$$

required for a virtual object point and a (coinciding real image point).

The power K of the first cross-section may be $$K = \frac{1}{f} = (n-1)\left(\frac{1}{R_1} - \frac{1}{R_2} + \frac{(n-1)d}{nR_1R_2}\right),$$

where n is the refractive index of the bulb, $R_1$ is the outer radius of curvature and $R_2$ is the inner radius of curvature of the first cross-section, and wherein the distance Δ between the first principal plane and a second principal plane of the first cross-section may be $$\Delta = d\left\{1 - \frac{1}{n} + \left(\frac{n-1}{n}\right)^2 \frac{d}{KR_1R_2}\right\},$$

where d is the thickness of wall of the bulb at the transverse axis.

The power K of the first cross-section may be 0, and the bulb comprises outer radius of curvature $r_1$ and inner radius of curvature $r_2$ of the second cross-section may satisfy the equations $$r_1 - d,$$

$$r_1 \approx -\frac{3d}{2} + \frac{d(n-1)}{n} + \frac{3R_1}{n-1} + \frac{(n-1)(d-R_1)^2R_1^2}{\left(d^2(n-1)^2 + 4nR_1^2\right)^{3/2}} + \frac{d^2(n-1)^2 + 2dnR_1 + 2nR_1^2}{n\sqrt{d^2(n-1)^2 + 4nR_1^2} -} - \frac{3\sqrt{d^2(n-1)^2 + 4nR_1^2}}{2(n-1)} \text{ and } r_2 = r_1 - d,$$

where d is thickness of wall of the bulb at the transverse axis, n is the refractive index of the bulb, $R_1$ is outer radius of curvature and $R_2$ is inner radius of curvature of the first cross-section.

The first cross-section may be afocal.

The inner and/or outer surface of the bulb may be polynomial with 4th and higher order corrections or may be defined by a conic constant unequal to zero to correct for substantial, non-paraxial NA of the lens arranged to focus the wavefront of the radiation from the laser to the virtual object.

The lens arranged to focus the wavefront of the radiation from the laser to the virtual object point may have a substantial NA.

The height z from the longitudinal axis of revolution y for the inner and/or outer surface of the bulb may satisfy the equation:

$$z = \frac{y^2}{R\left(1 + \sqrt{1-(1+C)y^2/R^2}\right)} + \sum_{i=2}^{N} \alpha_{2i} y^{2i},$$

where R is, respectively, the outer radius of curvature $R_1$ or the inner radius of curvature $R_2$ of the first cross-section, $\alpha_{2i}$ is polynomial coefficients and C is a conic constant.

The radiation from the laser may be IR.

The bulb may comprise at least one electrode and the longitudinal axis may be an electrode axis.

In accordance with a second aspect of the present invention, there is provided a laser-operated light source, comprising the assembly as described above, wherein the laser is configured to emit the radiation having the wavefront.

The laser-operated light source may be configured to emit light in operation and the light may comprise wavelengths in the UV spectral range.

The laser may be a continuous IR laser.

The laser-operated light source may be a laser pumped plasma source (LPPS).

The radiation may be emitted directly from the laser or may be emitted from the end of a fiber. The fiber may transport the radiation from the laser (which may be external to the laser pumped plasma source (LPPS)) to a point inside the laser pumped plasma source (LPPS).

In accordance with a third aspect of the present invention, there is provided a lithographic apparatus comprising a projection system configured to project a EUV or DUV radiation beam to project a pattern from a patterning device onto a substrate, wherein the lithographic apparatus comprises the assembly as described above or the laser operated light source as described above.

In accordance with a fourth aspect of the present invention, there is provided a metrology assembly, wherein the metrology assembly comprises the assembly as described above or the laser operated light source as described above.

The metrology assembly may be a UV level sensor.

In accordance with a fifth aspect of the present invention, there is provided a method for using an optical assembly for a laser-operated light source, the method comprising: providing a bulb, wherein the bulb comprises a chamber for accommodating an ionizable gas and a plasma formed by energizing the ionizable gas; providing a lens arranged to focus a wavefront of radiation from a laser to a virtual object point located inside the chamber, wherein the bulb comprises a longitudinal axis and a transverse axis perpendicular to the longitudinal axis; transmitting and refracting the wavefront of radiation to a first real image point in a first cross-section of the longitudinal axis and a second real image point in a second cross-section of the transverse axis such that the virtual object point, the first real image point and the second real image point coincide; wherein the second cross-section of the transverse axis comprises an outer surface cross-section and an inner surface cross-section, the outer surface cross-section and the inner surface cross-section being concentric and the first real image point and the second real image point being image conjugates of the virtual object point.

In accordance with a sixth aspect of the present invention, there is provided a method for manufacturing a bulb for a laser-operated light source, wherein the bulb comprises a chamber for accommodating an ionizable gas and a plasma formed by energizing the ionizable gas, wherein the bulb comprises a longitudinal axis and a transverse axis perpendicular to the longitudinal axis, and wherein, in use, the bulb is arranged to transmit and refract a wavefront of radiation from a laser to a first real image point in a first cross-section of the longitudinal axis and a second real image point in a second cross-section of the transverse axis, the second cross-section of the transverse axis comprising an outer surface cross-section and an inner surface cross-section, the outer surface cross-section and the inner surface cross-section being concentric, and the first real image point and the second real image point being image conjugates of a virtual object point located in the chamber that the wavefront of the radiation from the laser is focusable to by a lens; wherein the method comprises: selecting a refractive index n, a thickness d of a wall of the bulb at the transverse axis, an outer radius of curvature $r_1$ and an inner radius of curvature $r_2$ of the second cross-section, an outer radius of curvature $R_1$ and an inner radius of curvature $R_2$ of the first cross-section such that the virtual object point, the first real image point and the second real image point coincide.

In accordance with a seventh aspect of the present invention, there is provided an optical assembly comprising a bulb and a lens for a laser-operated light source, wherein the bulb comprises a chamber for accommodating an ionizable gas and a plasma formed by energizing the ionizable gas; wherein, in use, the lens is arranged to focus a wavefront of radiation from a laser to inside the chamber; wherein the bulb comprises a longitudinal axis and a transverse axis perpendicular to the longitudinal axis, and wherein, in use, the bulb and the lens together are arranged to transmit and refract the wavefront of the radiation to a single focus point in both a first cross-section of the longitudinal axis and a second cross-section of the transverse axis, the second cross-section of the transverse axis comprising an outer surface cross-section and an inner surface cross-section, the outer surface cross-section and the inner surface cross-section being concentric.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
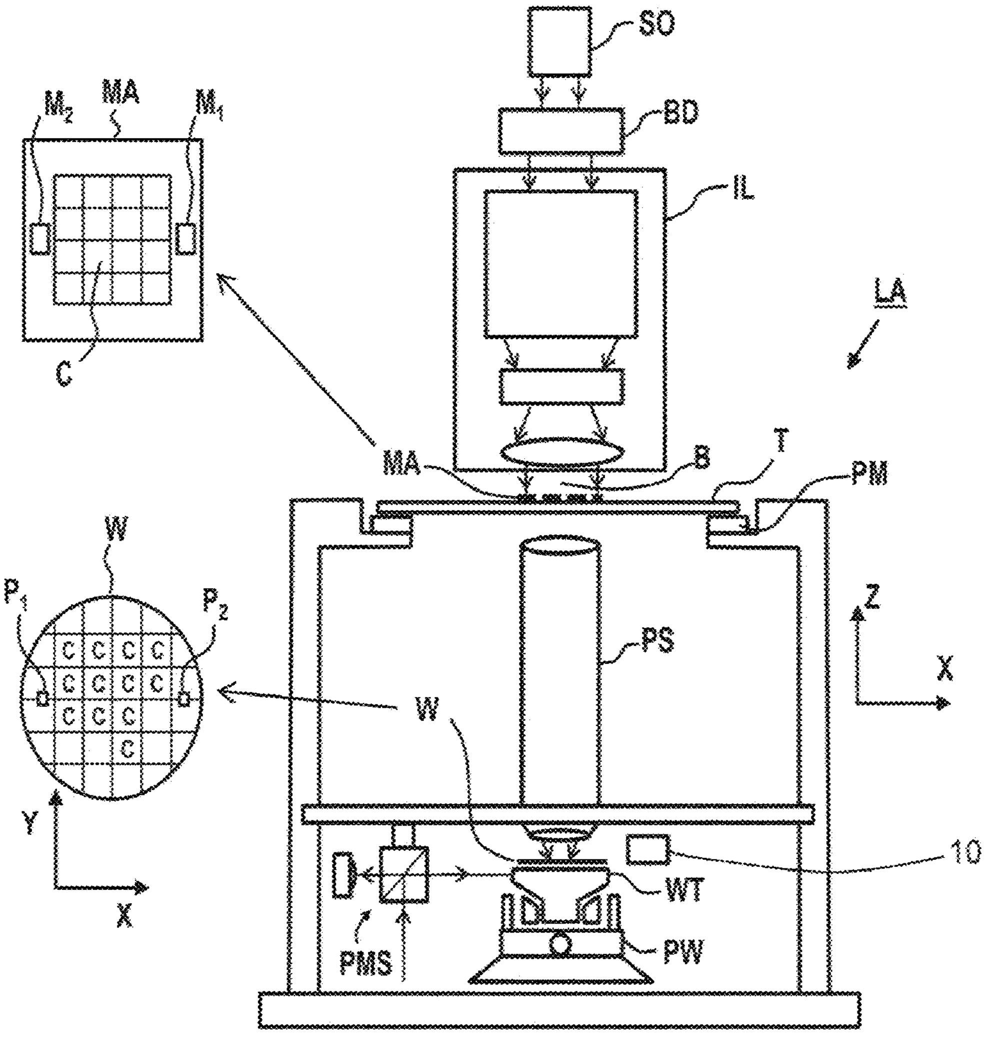
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross-section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

FIG. 1 also depicts a Laser-Pumped Plasma Source (LPPS) 10 used for e.g. leveling in the lithographic apparatus LA. A UV level sensor (not shown) may use the radiation (i.e. UV light) produced by the LPPS. More generally, the LPPS may be referred to as a laser-operated light source.

Figure 2:
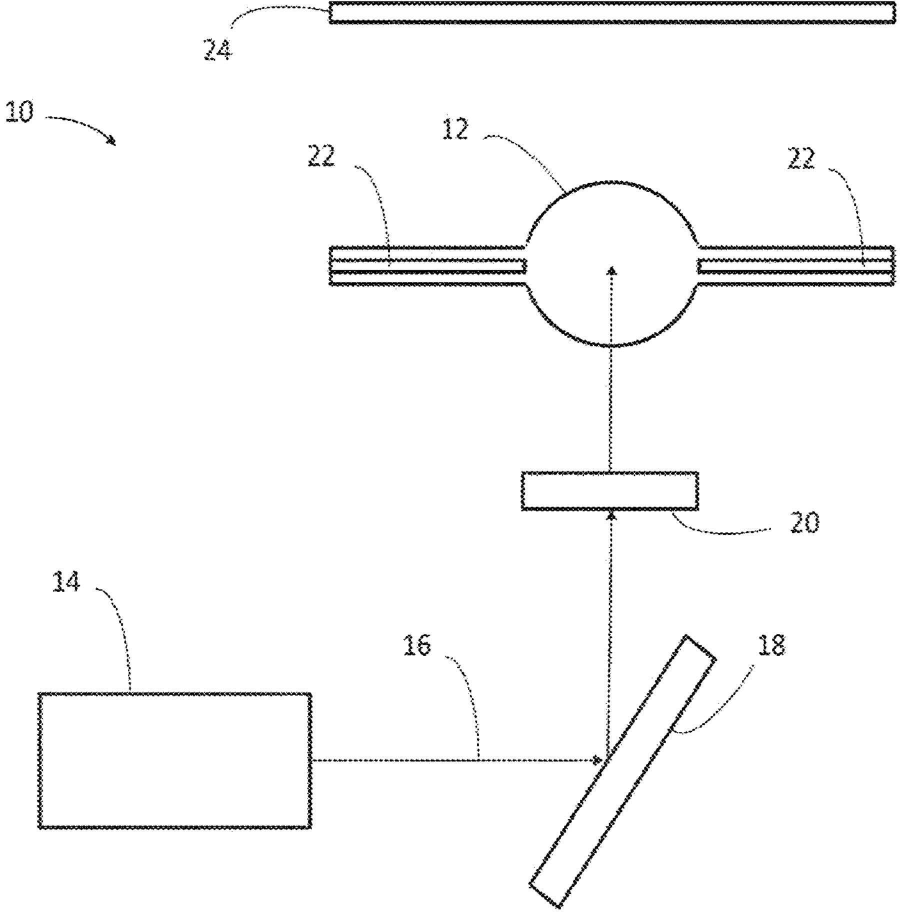
FIG. 2 depicts a Laser-Pumped Plasma Source (LPPS) according to an embodiment of the invention.

FIG. 2 depicts the LPPS 10 in more detail. The LPPS 10 includes a bulb 12 (or lamp bulb), which may be a Xenon-filled quartz bulb, that is ignited by electrical discharge and pumped by focusing a spherical wavefront of a continuous infrared (IR) laser (not shown) into the plasma at the center of the bulb 12. A light guide which may be an IR laser fiber 14 emits IR radiation 16, which may be reflected from an optional mirror 18 before being focused by a focusing lens 20 into the center of the bulb 12. That is, the focusing lens 20 is arranged to focus the wavefront of the IR radiation 16 from the laser to the center of the bulb 12. The electrical discharge is ignited using a spark from two electrodes 22 with the plasma being maintained by the incident IR radiation 16.

In the bulb 12, the IR radiation 16 is converted into broadband radiation including relatively high brightness UV light which is then passed through a light output window 24. It will be appreciated that, in other embodiments, the LPPS and bulb may be different from as described and shown in FIG. 2. For example, the bulb may be made from a different material, filled with a different ionizable gas or the laser may be of a different version to produce other types of radiation.

Figure 3:
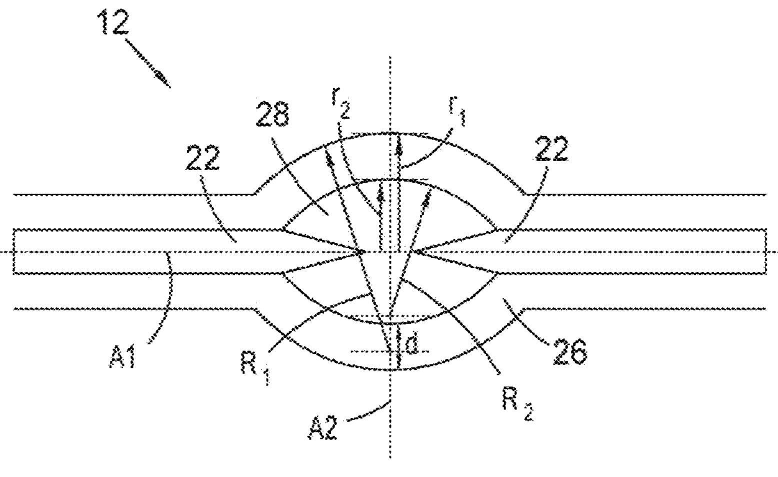
FIG. 3 depicts a schematic diagram of a cross-section of a bulb according to an embodiment of the present invention.

FIG. 3 depicts a schematic cross-section of the bulb 12 taken in a plane along a longitudinal axis A1 of the bulb 12. This cross-section may be referred to as a first cross-section of the longitudinal axis A1. The two electrodes 22 are also shown orientated along the longitudinal axis A1 and thus the longitudinal axis may be referred to as an electrode axis. Also depicted is a transverse axis A2, which is perpendicular to the longitudinal axis A1 and taken along an equator plane of the bulb 12, which splits the bulb 12 symmetrically in half. A second cross-section of the transverse axis is a cross-section taken along the equator plane of the bulb 12 (i.e. a plane perpendicular to the longitudinal axis). The longitudinal axis A1 and the transverse axis A2 are taken through the center of the bulb 12. The naming of the longitudinal and transverse axes has been chosen based on the axial symmetry of the bulb 12. However, it will be understood that a conventional definition of longitudinal and transverse axis in lens design may be different (i.e. the opposite). In the conventional definition e.g. a 'longitudinal ray aberration' is the deviation of a ray intersection with a lens' optical axis w.r.t the paraxial focus and a 'transverse ray aberration' is a deviation of a ray intersection with the paraxial image plane to its paraxial image location (so perpendicular to the optical axis). Here, the IR beam 16 is focused along an optical axis (the conventional longitudinal axis of the focusing lens 20) which is perpendicular to the axis of revolution of the bulb 12.

The bulb 12 is a volume of revolution defined by an inner curve and an outer curve that are swept around the longitudinal axis A1. Thus, in general, a bulb 12 has different curvatures (in general non-concentric) in the first cross-section through the longitudinal axis A1 compared to those in the (concentric) second cross-section (the cross-section through the equator of the bulb 12). The bulb has a wall 26 (made of quartz) which surrounds a hollow chamber 28 for accommodating the Xenon gas. The wall 26 may have a thickness d between the inner and outer surfaces of the wall 26 of the bulb 12 at the transverse axis. The second cross-section of the transverse axis A2 includes an outer surface cross-section and an inner surface cross-section, the outer surface cross-section and the inner surface cross-section being concentric. The first cross-section of the longitudinal axis A1 includes an outer surface cross-section and an inner surface cross-section, the outer surface cross-section and the inner surface cross-section being non-concentric (except in the trivial case of a spherical bulb).

FIG. 3 depicts non concentric radii of curvature, i.e. an outer radius of curvature $R_1$ and an inner radius of curvature $R_2$ of the first cross-section, and concentric radii of curvature, i.e. an outer radius of curvature $r_1$ and an inner radius of curvature $r_2$ of the second cross-section.

This means that a bulb shape may act like a toroidal lens with two different focal lengths in the two cross-sectional planes. This potentially causes astigmatism in a transmitted wavefront focused at the center of the bulb. Particular care must be taken when choosing bulb's design parameters so the design does not introduce astigmatism or other on-axis aberrations. On-axis aberrations in this context means the transverse axis A2, which coincides with the optical axis of the focusing lens 20.

Ideally, both the (aspherical) focusing lens 20 and the bulb 12 should introduce minimal optical aberrations to the IR wavefront transmitted through the bulb 12. Any significant wavefront aberration will increase the focused spot size and reduce the energy density of the focused IR in the plasma. This in turn reduces the brightness and power of the converted light from the LPPS plasma. Consequently, the shape of the bulb 12 is of great importance to the performance of the LPPS 10. By measuring the IR wavefront transmitted through the bulb, it has been found that bulbs may cause a large amount of astigmatism to the wavefront, with very strong astigmatic line foci and a much broadened focused spot. In this case, the focused spot is very far off from being diffraction-limited.

Figure 4:
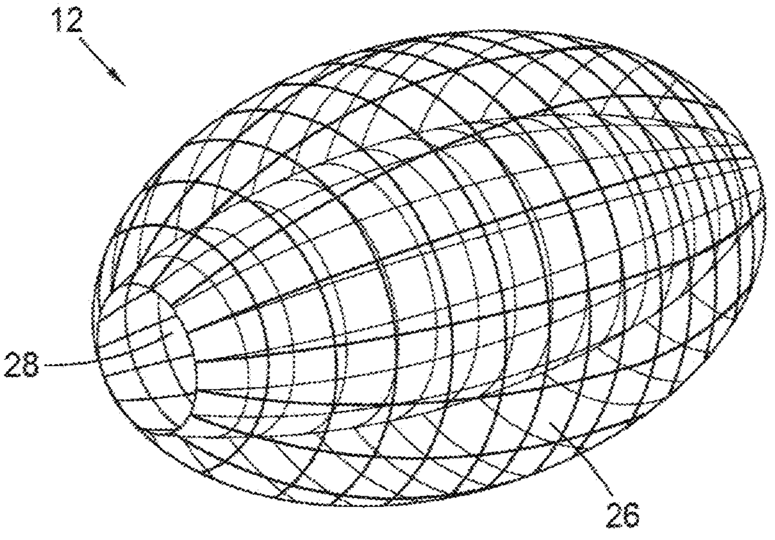
FIG. 4 depicts a 3d visualization of a bulb according to an embodiment of the present invention.

FIG. 4 depicts a 3D visualization of an embodiment of a non-spherical bulb 12 that is free of on-axis astigmatism (i.e. astigmatism of the focused wavefront of IR radiation 16 on the longitudinal axis A1 has been reduced or eliminated). The astigmatism is eliminated in the ideal case of complete absence of manufacturing imperfections and in the absence of (small) positioning errors. In reality nothing is perfect so there may always be a small amount of astigmatism, although the astigmatism may be reduced to such an extent that it may be considered to be completely negligible for practical purposes. The bulb 12 is described by n=1.451, d=2 mm, $r_1$=4.471 mm, $r_2$=2.471 mm, $R_1$=10 mm and $R_2$=20 mm. In this embodiment, a spherical wavefront focused at the center of the bulb 12 will be transmitted as an essentially unchanged spherical wavefront with negligible added aberrations. There are two openings in this 3D shape, one of which is visible in the figure. These openings indicate the locations of the bulb's electrodes 22.

The parameters above are merely exemplary and there are many values of the parameters that would provide the given advantage. The parameters of the bulb 12 are chosen such that the rays of the focused spherical wavefront in the first cross-section of the longitudinal axis A1 and the second cross-section of the transverse axis A2 converge to the same point at the center of the bulb 12. This results in a non-spherical bulb shape that is free of on-axis astigmatism.

The solution space of all (non-trivial) bulb shapes that allow a spherical focused wavefront to be transmitted into the bulb 12 as an essentially unchanged spherical wavefront may be shown analytically. The trivial bulb shape that enables this is the perfectly spherical bulb shape. However, due to bulb manufacturing technology this bulb shape is not easy to produce and therefore commercial bulbs are typically non-spherical (i.e. they have a non-concentric first cross-section of the longitudinal axis A1).

Basic paraxial lens design principles may be used to describe the relations between the refractive index n of the bulb 12, a thickness d of a wall of the bulb 12 at the transverse axis A2, an outer radius of curvature $r_1$ and an inner radius of curvature $r_2$ of the second cross-section, an outer radius of curvature $R_1$ and an inner radius of curvature $R_2$ of the first cross-section.

Figure 5A:
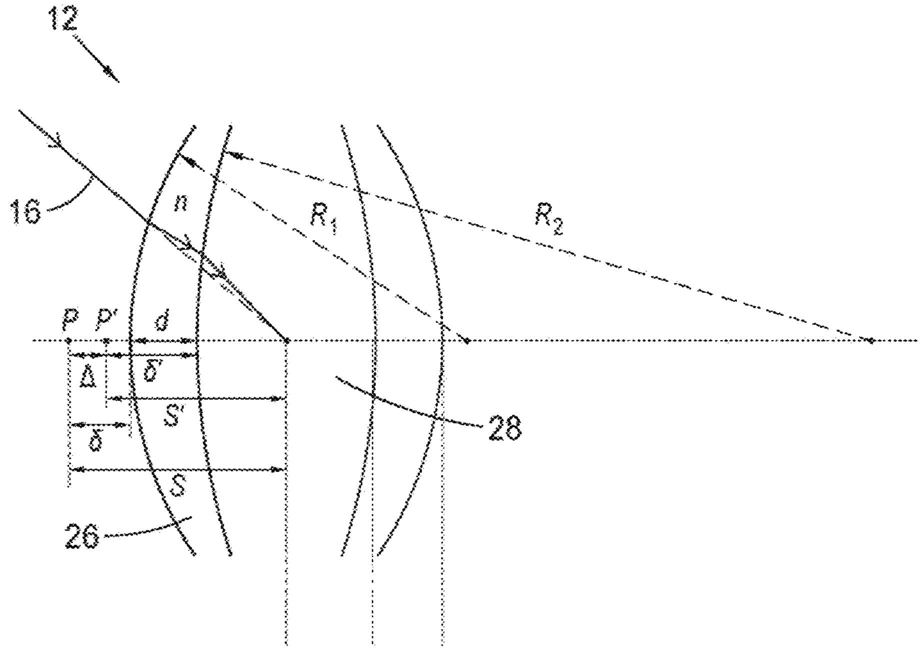
FIG. 5*a* depicts a schematic diagram of a cross-section of a longitudinal axis of a bulb according to an embodiment of the present invention.
Figure 5B:
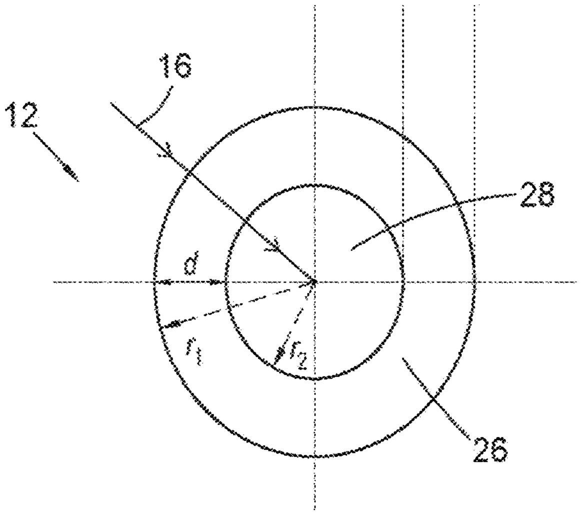
FIG. 5*b* depicts a schematic diagram of a cross-section of a transverse axis of a bulb according to an embodiment of the present invention.

FIGS. 5*a* and 5*b* show a schematic of an essentially toroidal bulb shape that is free of on-axis astigmatism. In FIG. 5*a*, the bulb cross-section through the longitudinal axis (i.e. the first cross-section) is depicted, and, in FIG. 5*b*, the concentric cross-section through the bulb's equator (i.e. the second cross-section) is depicted. In the following derivation of the solutions for the optimal bulb parameters, on-axis parameters in the two bulb cross-sections depicted in FIGS. 5*a* and 5*b* are used.

The focus point of the (aspherical) focusing lens 20 may be considered to be a virtual object that is to be imaged by the two bulb cross-sections (i.e. the first cross-section and the second cross-section) to a real image point that (in both cross-sections) must coincide with the virtual object point. It may be considered that the bulb 12 and the focusing lens 20 are arranged such that there is a single focus point in both the first cross-section and the second cross-section. The first real image point of the first cross-section and the second real image point of the second cross-section are image conjugates of the virtual object point. The virtual object point is the center of the bulb 12.

These conditions can be derived using paraxial optics and first principles in lens design. To this end, a side (i.e. one half) of the first cross-section of the bulb 12 may be considered to be a thick lens (see left side of FIG. 5*a*).

The power K of a thick lens (of the first cross-section) is the inverse of its principal focal length f, and is described by the lensmaker's equation:

$$K = \frac{1}{f} = (n-1)\left(\frac{1}{R_1} - \frac{1}{R_2} + \frac{(n-1)d}{nR_1R_2}\right) \tag{1}$$

with refractive index n, outer radius of curvature $R_1$, inner radius of curvature $R_2$ and on-axis thickness d. The radii of curvature have signs. The radii are positive if the center of curvature is to the right of the surface vertex and negative if the center is to the left of the surface vertex. In FIG. 5*a*, both $R_1$ and $R_2$ are positive.

The transmitted and focused IR beam needs to coincide with the focus point of the aspherical focusing lens 20. This point may be considered to be a virtual object point because it is located on the same side of the curved bulb wall 26 that images this virtual object point to a real image point. In fact the virtual object point and the real image point need to coincide.

For this, the object and image distances from the thick lens (of the first cross-section) are determined. For a lens of finite thickness these distances are measured from the principal points P and P' (see FIG. 5*a*) where the optical axis intersect the first and second principal plane of the lens. The distance & from the outer surface vertex to the first principal plane at P can be shown to be:

$$\delta = -\frac{(n-1)}{n} \cdot \frac{d}{KR_2} \tag{2}$$

and similarly, for the distance δ' from the inner surface vertex to the second principal plane at P', may be shown to be:

$$\delta' = -\frac{(n-1)}{n} \cdot \frac{d}{KR_1} \tag{3}$$

These distances also have a sign similar to the radii of curvature. The distance is positive if the principal plane is to the right of its respective surface and negative when it is to its left. In FIG. 5*a*, both δ and δ' are negative. The distance Δ between the two principal planes can be shown to be:

$$\Delta = d\left\{1 - \frac{1}{n} + \left(\frac{n-1}{n}\right)^2 \frac{d}{KR_1R_2}\right\}. \tag{4}$$

The relation between the power K of a lens, the object distance S measured from P, and the image distance S' measured from P' is:

$$K = \frac{1}{S} + \frac{1}{S'}. \tag{5}$$

The object distance S and the image distance S' also have signs. The object distance S is positive in the case of a real object that is to the left of the first principal plane. It is negative in the case of a virtual object that is to the right of the first principal plane. The image distance S' is positive in the case of a real image that is to the right of the second principal plane. It is negative in the case of a virtual image that is to the left of the second principal plane. In the situation of FIG. 5, there is a virtual object point (negative S) and a real image (positive S'). The virtual object point and its real image need to coincide at the same on-axis point. The condition is fulfilled when:

$$-S' = S + \Delta \tag{6}$$

By substituting Equation (6) into Equation (5), then the following may be obtained:

$$S^2 + S\Delta - \frac{\Delta}{K} = 0 \tag{7}$$

which has the two solutions:

$$S^{\pm} = \frac{-\Delta \pm \sqrt{\Delta^2 + 4\Delta/K}}{2}. \tag{8}$$

The negative solution $S^-$ is the solution required for a virtual object point and a (coinciding) real image point.

The other cross-section through the bulb's equator (i.e. the second cross-section) is concentric due to axial symmetry of the bulb 12. This second cross-section may also be considered as a thick concentric meniscus lens (see FIG. 5*b*). A concentric meniscus lens has its principal points P and P' located at the concentric center of curvature. Since the principal points P and P' are conjugates, a virtual object point at the center of curvature is also imaged to a real image at the center of curvature with unit magnification.

To complete a description of the parameters of general bulbs free of on-axis astigmatism, the virtual object and real image points are made to coincide in both cross-sections. That is, the virtual object point located in the chamber 28 of the bulb 12, the first real image point of the first cross-section of the longitudinal axis A1 and the second real image point of the second cross-section of the transverse axis A2 coincide so as to reduce or eliminate astigmatism of the focused wavefront on the longitudinal axis A1. This is the case when, for the two concentric radii of curvature $r_1$ and $r_2$ of the second cross-section (through the equator):

$$r_1 = \delta - S^- \tag{9}$$

and $$r_2 = r_1 - d. \tag{10}$$

Any on-axis astigmatism arises due to the real image in the first cross-section of the longitudinal axis A1 not coinciding with the real image in the second (concentric) cross-section. Rays in the second cross-section (through the transverse axis A2) that are focused at the center of the second (concentric) cross-section do not refract, whereas, in general, rays in the first cross-section (through the longitudinal axes) do refract and can cause astigmatism if they do not refract to focus at the bulb center.

Equations 8, 9 and 10 (for which Equations 4 and 1 are required) together describe the solution space of refractive index n (of the bulb), on-axis thickness d (i.e. a thickness d of a wall of the bulb at the transverse axis A2 (and at the longitudinal axis A1)) and four on-axis radii of curvature (i.e. outer radius of curvature $r_1$ and inner radius of curvature $r_2$ of the second cross-section, outer radius of curvature $R_1$ and inner radius of curvature $R_2$ of the first cross-section) for all bulb 12 shapes that, in the paraxial approximation, are free of on-axis astigmatism.

In other words, the bulb 12 comprises a refractive index n, a thickness d of a wall of the bulb at the transverse axis, an outer radius of curvature $r_1$ and an inner radius of curvature $r_2$ of the second cross-section, an outer radius of curvature $R_1$ and an inner radius of curvature $R_2$ of the first cross-section such that the virtual object point, the first real image point of the first cross-section and the second real image point of the second cross-section coincide Embodiments include manufacturing a bulb 12 by selecting a refractive index n, a thickness d of a wall of the bulb 12 at the transverse axis A2, an outer radius of curvature $r_1$ and an inner radius of curvature $r_2$ of the second cross-section, an outer radius of curvature $R_1$ and an inner radius of curvature $R_2$ of the first cross-section such that the virtual object point, the first real image point and the second real image point coincide.

The bulb 12 in this solution space provides improved brightness and power of the converted light from the LPPS plasma when compared to bulbs not falling within this solution space. There are examples of poorly performing LPPS bulbs where the astigmatism from the bulb reduced the LPPS brightness and power by more than a factor 2. Thus, well-corrected bulbs 12 can thus avoid the brightness loss of about a factor of 2.

The above analysis breaks down for the special case in which the bulb 12 has power K=0 in the first cross-section (the cross-section through the electrode axis). When this happens the first cross-section of the bulb 12 is said to be afocal. Inserting K=0 into Equation (1) gives the afocal condition:

$$R_2 = R_1 - \frac{n-1}{n}d \tag{11}$$

For an afocal cross-section the principal planes go to infinity, the object and image distance become meaningless and Equation (5) can no longer be used to determine object and image conjugates. The analytical expressions for the position of a virtual object point that coincides with its 'image' through the afocal lens are indeterminate for K=0 so it is not possible to give a meaningful analytic expression for $r_1$ in the second cross-section (the cross-section through the bulb's equator). However, it can be shown that a very good analytic approximate expression can be found using a Taylor expansion up to $2^{nd}$ order near the offending asymptotic point. Using this approach for an afocal cross-section gives:

$$r_1 \approx -\frac{3d}{2} + \frac{d(n-1)}{n} + \frac{3R_1}{n-1} + \frac{(n-1)(d-R_1)^2R_1^2}{\left(d^2(n-1)^2 + 4nR_1^2\right)^{3/2}} + \frac{d^2(n-1)^2 + 2dnR_1 + 2nR_1^2}{n\sqrt{d^2(n-1)^2 + 4nR_1^2}} - \frac{\sqrt[3]{d^2(n-1)^2 + 4nR_1^2}}{2(n-1)} \tag{12}$$

The second cross-section (the cross-section through the electrodes axis) is still concentric, so the inner radius $r_2$ of the second cross-section is still given by:

$$r_2 = r_1 - d. \tag{13}$$

The approximation accuracy of Equation (12) may be verified by comparison with a solution found using the local optimizer in raytrace code Zemax OpticStudio for an afocal cross-section with parameters n=1.4507757876, d=2 mm, $R_1$=8 mm and $R_2$=7.3785727726 mm. From Equation (12) a value $r_1$=−4.8686928018 may be found and, with Zemax, $r_1$=−4.8787964555. The difference is 0.21%.

The focusing lens 20 of the LPPS 10 has a substantial NA (numerical aperture), and so aberrations other than on-axis astigmatism can become significant for exactly circular bulb cross-sections. This causes no problems in the concentric cross-section through the bulb's 12 equator (i.e. the second cross-section) because there is no refraction of the rays to an on-axis virtual object point regardless of NA. However, in the cross-section through the electrode axis (i.e. the first cross-section) a substantial, non-paraxial, NA will introduce 4th and higher order aberrations in the wavefront cross-section in a plane through the electrode axis. In principle, these can be corrected for by making the inner and/or outer surface of the bulb 12 polynomial with small $4^{th}$ and higher order corrections, or defined by a conic constant unequal to zero. In such case the inner and/or outer surface of the bulb 12 can be described by an even aspheric equation with on-axis radius of curvature R (for either $R_1$ or $R_2$), a conic constant C to make the surface aspherical and/or polynomial coefficients $\alpha_{2i}$, to depart from the spherical description. The height z from the longitudinal (electrode) axis A1 of revolution y of such surface may then be described as:

$$z = \frac{y^2}{R\left(1 + \sqrt{1 - (1+C)y^2/R^2}\right)} + \sum_{i=2}^{N}\alpha_{2i}y^{2i}. \tag{14}$$

where y is a coordinate along the axis of revolution. Here, the y-axis coincides with the electrode (longitudinal) axis, with y=0 coinciding with the center of the bulb 12.

In general, the magnification is not exactly 1 when a real image point coincides with its virtual object point. This is because, while these two points may coincide, the object distance S and image distance S' are measured from the principal planes, which are separated by a distance Δ according to Equation 4. The object and image distances are thus in general not equal when a real image point coincides with its virtual object point and the bulb is non-spherical. The magnification is thus M=−S'/S, which is less than 1 in all cases except for the spherical concentric bulb shape. The magnification is only equal to 1 in the concentric cross-section (i.e. the second cross-section). Non-spherical bulbs that are free of on-axis astigmatism are therefore always somewhat anamorphic. This means that transmitted wavefront is still spherical but that the NAs of the IR 16 in the two cross-sections (first cross-section and second cross-section) of the bulb 12 are not equal. The exit pupil contour thus becomes elliptical.

The above analysis only pertains to the parts of the bulb 12 surfaces that are used to pass the focused IR beam 16. Outside of these areas the surface shapes are irrelevant to the transmitted wavefront.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below. Other aspects of the invention are set out as in the following numbered clauses:

1. An optical assembly comprising a bulb and a lens for a laser-operated light source, wherein the bulb comprises a chamber for accommodating an ionizable gas and a plasma formed by energizing the ionizable gas;

wherein, in use, the lens is arranged to focus a wavefront of radiation from a laser to a virtual object point located inside the chamber;

wherein the bulb comprises a longitudinal axis and a transverse axis perpendicular to the longitudinal axis, wherein, in use, the bulb is arranged to transmit and refract the wavefront of the radiation to a first real image point in a first cross-section of the longitudinal axis and a second real image point in a second cross-section of the transverse axis, the second cross-section of the transverse axis comprising an outer surface cross-section and an inner surface cross-section, the outer surface cross-section and the inner surface cross-section being concentric, and the first real image point and the second real image point being image conjugates of the virtual object point; and wherein the virtual object point, the first real image point and the second real image point coincide.

2. The assembly of clause 1, wherein the bulb comprises a refractive index n, a thickness d of a wall of the bulb at the transverse axis, an outer radius of curvature $r_1$ and an inner radius of curvature $r_2$ of the second cross-section, an outer radius of curvature $R_1$ and an inner radius of curvature $R_2$ of the first cross-section such that the virtual object point, the first real image point and the second real image point coincide.

3. The assembly of any preceding clause, wherein the bulb comprises outer radius of curvature $r_1$ and inner radius of curvature $r_2$ of the second cross-section that satisfy the equations: $r_1=\delta-S^-$ and $r_2=r_1-d$, where $\delta$ is the distance from the first cross-section outer surface vertex to a first principal plane at principal point P of the first cross-section, d is the thickness of wall of the bulb at the transverse axis and $S^-$ is the object distance from the first principal plane and is calculated from $$S^- = \frac{-\Delta \pm \sqrt{\Delta^2 + 4\Delta/K}}{2},$$

where $\Delta$ is the distance between the first principal plane and a second principal plane at principal point P' of the first cross-section, and K is the power of the first cross-section.

4. The assembly of clause 3, wherein the power K of the first cross-section is $$K = \frac{1}{f} = (n-1)\left(\frac{1}{R_1} - \frac{1}{R_2} + \frac{(n-1)d}{nR_1R_2}\right),$$

where n is the refractive index of the bulb, $R_1$ is the outer radius of curvature and $R_2$ is the inner radius of curvature of the first cross-section, and wherein the distance $\Delta$ between the first principal plane and a second principal plane of the first cross-section is $$\Delta = d\left\{1 - \frac{1}{n} + \left(\frac{n-1}{n}\right)^2 \frac{d}{KR_1R_2}\right\},$$

where d is the thickness of wall of the bulb at the transverse axis.

5. The assembly of any of clauses 1 or 2, wherein the power K of the first cross-section is 0, and the bulb comprises outer radius of curvature $r_1$ and inner radius of curvature $r_2$ of the second cross-section that satisfy the equations $$r_1 \approx -\frac{3d}{2} + \frac{d(n-1)}{n} + \frac{3R_1}{n-1} + \frac{(n-1)(d-R_1)^2R_1^2}{\left(d^2(n-1)^2 + 4nR_1^2\right)^{3/2}} + \frac{d^2(n-1)^2 + 2nR_1 + 2nR_1^2}{\sqrt[n]{d^2(n-1)^2 + 4nR_1^2}} - \frac{\sqrt[3]{d^2(n-1)^2 + 4nR_1^2}}{2(n-1)} \text{ and } r_2 = r_1 - d$$

where d is thickness of wall of the bulb at the transverse axis, n is the refractive index of the bulb, $R_1$ is outer radius of curvature and $R_2$ is inner radius of curvature of the first cross-section.

6. The assembly of any preceding clause, wherein the inner and/or outer surface of the bulb is polynomial with 4th and higher order corrections or defined by a conic constant unequal to zero to correct for substantial, non-paraxial NA of the lens arranged to focus the wavefront of the radiation from the laser to the virtual object.

7. The assembly of clause 6, wherein the height z from the longitudinal axis of revolution y for the inner and/or outer surface of the bulb satisfies the equation:

$$z = \frac{y^2}{R\left(1 + \sqrt{1 - (1+C)y^2/R^2}\right)} + \sum_{i=2}^{N} \alpha_{2i} y^{2i},$$

where R is, respectively, the outer radius of curvature $R_1$ or the inner radius of curvature $R_2$ of the first cross-section, $\alpha_{2i}$ is polynomial coefficients and C is a conic constant.

8. The assembly of any preceding clause, wherein the radiation from the laser is IR.

9. The assembly of any preceding clause, wherein the bulb comprises at least one electrode and the longitudinal axis is an electrode axis.

10. A laser-operated light source comprising the assembly of any preceding clause, wherein the laser is configured to emit the radiation having the wavefront.

11. The laser-operated light source of clause 10, wherein the laser-operated light source is configured to emit light in operation and the light comprises wavelengths in the UV spectral range.

12. A lithographic apparatus comprising a projection system configured to project a EUV or DUV radiation beam to project a pattern from a patterning device onto a substrate, wherein the lithographic apparatus comprises the assembly of any of claims 1-9 or the laser operated light source of either of clauses 10 or 11.

13. A metrology assembly, wherein the metrology assembly comprises the assembly of any of clauses 1-9 or the laser operated light source of either of clauses 10 or 11.

14. A method for using an optical assembly for a laser-operated light source, the method comprising:

providing a bulb, wherein the bulb comprises a chamber for accommodating an ionizable gas and a plasma formed by energizing the ionizable gas; providing a lens arranged to focus a wavefront of radiation from a laser to a virtual object point located inside the chamber, wherein the bulb comprises a longitudinal axis and a transverse axis perpendicular to the longitudinal axis;

transmitting and refracting the wavefront of radiation to a first real image point in a first cross-section of the longitudinal axis and a second real image point in a second cross-section of the transverse axis such that the virtual object point, the first real image point and the second real image point coincide; wherein the second cross-section of the transverse axis comprises an outer surface cross-section and an inner surface cross-section, the outer surface cross-section and the inner surface cross-section being concentric and the first real image point and the second real image point being image conjugates of the virtual object point.

15. A method for manufacturing a bulb for a laser-operated light source, wherein the bulb comprises a chamber for accommodating an ionizable gas and a plasma formed by energizing the ionizable gas, wherein the bulb comprises a longitudinal axis and a transverse axis perpendicular to the longitudinal axis, and wherein, in use, the bulb is arranged to transmit and refract a wavefront of radiation from a laser to a first real image point in a first cross-section of the longitudinal axis and a second real image point in a second cross-section of the transverse axis, the second cross-section of the transverse axis comprising an outer surface cross-section and an inner surface cross-section, the outer surface cross-section and the inner surface cross-section being concentric, and the first real image point and the second real image point being image conjugates of a virtual object point located in the chamber that the wavefront of the radiation from the laser is focusable to by a lens;

wherein the method comprises:

selecting a refractive index n, a thickness d of a wall of the bulb at the transverse axis, an outer radius of curvature $r_1$ and an inner radius of curvature $r_2$ of the second cross-section, an outer radius of curvature $R_1$ and an inner radius of curvature $R_2$ of the first cross-section such that the virtual object point, the first real image point and the second real image point coincide.

The invention claimed is:

1. An optical assembly comprising:

a bulb having a chamber for accommodating an ionizable gas and a plasma formed by energizing the ionizable gas, the bulb having a longitudinal axis and a transverse axis perpendicular to the longitudinal axis; and a lens for a laser-operated light source, the lens arranged to, in use, focus a wavefront of radiation from a laser to a virtual object point located inside the chamber, wherein, in use, the bulb is arranged to transmit and refract the wavefront of the radiation to a first real image point in a first cross-section of the longitudinal axis and a second real image point in a second cross-section of the transverse axis, the second cross-section of the transverse axis comprising an outer surface cross-section and an inner surface cross-section, the outer surface cross-section and the inner surface cross-section being concentric, and the first real image point and the second real image point being image conjugates with the virtual object point, and wherein the virtual object point, the first real image point and the second real image point coincide.

2. The assembly of claim 1, wherein the bulb comprises a refractive index n, a thickness d of a wall of the bulb at the transverse axis, an outer radius of curvature $r_1$ and an inner radius of curvature $r_2$ of the second cross-section, and an outer radius of curvature $R_1$ and an inner radius of curvature $R_2$ of the first cross-section such that the virtual object point, the first real image point and the second real image point coincide.

3. The assembly of claim 1, wherein the bulb comprises outer radius of curvature $r_1$ and inner radius of curvature $r_2$ of the second cross-section that satisfy the equations: $r_1=\delta-S^-$ and $r_2=r_1-d$, where $\delta$ is the distance from the first cross-section outer surface vertex to a first principal plane at principal point P of the first cross-section, d is the thickness of wall of the bulb at the transverse axis and $S^-$ is the object distance from the first principal plane and is calculated from $$S^- = \frac{-\Delta \pm \sqrt{\Delta^2 + 4\Delta/K}}{2},$$

where $\Delta$ is the distance between the first principal plane and a second principal plane at principal point P' of the first cross-section, and K is the power of the first cross-section.

4. The assembly of claim 3, wherein the power K of the first cross-section is $$K = (n-1)\left(\frac{1}{R_1} - \frac{1}{R_2} + \frac{(n-1)d}{nR_1R_2}\right),$$

where n is the refractive index of the bulb, $R_1$ is the outer radius of curvature and $R_2$ is the inner radius of curvature of the first cross-section, and wherein the distance $\Delta$ between the first principal plane and a second principal plane of the first cross-section is $$\Delta = d\left\{1 - \frac{1}{n} + \left(\frac{n-1}{n}\right)^2 \frac{d}{KR_1R_2}\right\},$$

where d is the thickness of wall of the bulb at the transverse axis.

5. The assembly of claim 1, wherein the power K of the first cross-section is 0, and the bulb comprises outer radius of curvature $r_1$ and inner radius of curvature $r_2$ of the second cross-section that satisfy the equations $$r_1 \approx -\frac{3d}{2} + \frac{d(n-1)}{n} + \frac{3R_1}{n-1} + \frac{(n-1)(d-R_1)^2R_1^2}{\left(d^2(n-1)^2 + 4nR_1^2\right)^{3/2}} + \frac{d^2(n-1)^2 + 2dnR_1 + 2nR_1^2}{\sqrt[n]{d^2(n-1)^2 + 4nR_1^2}} - \frac{\sqrt[3]{d^2(n-1)^2 + 4nR_1^2}}{2(n-1)} \text{ and } r_2 = r_1 - d,$$

where d is thickness of wall of the bulb at the transverse axis, n is the refractive index of the bulb, and $R_1$ is outer radius of curvature and $R_2$ is inner radius of curvature of the first cross-section.

6. The assembly of claim 1, wherein the inner and/or outer surface of the bulb is a polynomial with 4th and higher order corrections or defined by a conic constant unequal to zero to correct for substantial, non-paraxial numerical aperture of the lens arranged to focus the wavefront of the radiation from the laser to the virtual object.

7. The assembly of claim 6, wherein a height z from the longitudinal axis of revolution for the inner and/or outer surface of the bulb satisfies the equation:

$$z = \frac{y^2}{R\left(1 + \sqrt{1 - (1+C)y^2/R^2}\right)} + \sum\nolimits_{i=2}^{N} \alpha_{2i} y^{2i},$$

where R is, respectively, the outer radius of curvature $R_1$ or the inner radius of curvature $R_2$ of the first cross-section, $\alpha_{2i}$ is polynomial coefficients, y is a coordinate along the axis of revolution and C is a conic constant.

8. The assembly of claim 1, wherein the radiation from the laser is infrared.

9. The assembly of claim 1, wherein the bulb comprises at least one electrode and the longitudinal axis is an electrode axis.

10. A laser-operated light source comprising the assembly of claim 1, wherein the laser is configured to emit the radiation having the wavefront.

11. The source of claim 10, configured to emit light in operation and the light comprises wavelengths in the UV spectral range.

12. A lithographic apparatus comprising a projection system configured to project a EUV or DUV radiation beam to project a pattern from a patterning device onto a substrate, wherein the lithographic apparatus comprises the assembly of claim 1.

13. A metrology assembly, wherein the metrology assembly comprises the assembly of claim 1.

14. A method comprising:

providing a bulb, wherein the bulb comprises a chamber for accommodating an ionizable gas and a plasma formed by energizing the ionizable gas and the bulb comprises a longitudinal axis and a transverse axis perpendicular to the longitudinal axis;

providing a lens arranged to focus a wavefront of radiation from a laser to a virtual object point located inside the chamber; and transmitting and refracting the wavefront of radiation to a first real image point in a first cross-section of the longitudinal axis and a second real image point in a second cross-section of the transverse axis such that the virtual object point, the first real image point and the second real image point coincide, wherein the second cross-section of the transverse axis comprises an outer surface cross-section and an inner surface cross-section, the outer surface cross-section and the inner surface cross-section being concentric and the first real image point and the second real image point being image conjugates with the virtual object point.

15. A method for manufacturing a bulb for a laser-operated light source, wherein the bulb comprises a chamber for accommodating an ionizable gas and a plasma formed by energizing the ionizable gas, wherein the bulb comprises a longitudinal axis and a transverse axis perpendicular to the longitudinal axis, and wherein, in use, the bulb is arranged to transmit and refract a wavefront of radiation from a laser to a first real image point in a first cross-section of the longitudinal axis and a second real image point in a second cross-section of the transverse axis, the second cross-section of the transverse axis comprising an outer surface cross-section and an inner surface cross-section, the outer surface cross-section and the inner surface cross-section being concentric, and the first real image point and the second real image point being image conjugates with a virtual object point located in the chamber that the wavefront of the radiation from the laser is focusable to by a lens;

wherein the method comprises:

selecting a refractive index n, a thickness d of a wall of the bulb at the transverse axis, an outer radius of curvature $r_1$ and an inner radius of curvature $r_2$ of the second cross-section, and an outer radius of curvature $R_1$ and an inner radius of curvature $R_2$ of the first cross-section such that the virtual object point, the first real image point and the second real image point coincide.

16. The method of claim 14, wherein the bulb comprises a refractive index n, a thickness d of a wall of the bulb at the transverse axis, an outer radius of curvature $r_1$ and an inner radius of curvature $r_2$ of the second cross-section, and an outer radius of curvature $R_1$ and an inner radius of curvature $R_2$ of the first cross-section such that the virtual object point, the first real image point and the second real image point coincide.

17. The method of claim 14, wherein the bulb comprises outer radius of curvature $r_1$ and inner radius of curvature $r_2$ of the second cross-section that satisfy the equations: $r_1=\delta-S^-$ and $r_2=r_1-d$, where $\delta$ is the distance from the first cross-section outer surface vertex to a first principal plane at principal point P of the first cross-section, d is the thickness of wall of the bulb at the transverse axis and $S^-$ is the object distance from the first principal plane and is calculated from $$S^- = \frac{-\Delta \pm \sqrt{\Delta^2 + 4\Delta/K}}{2},$$

where Δ is the distance between the first principal plane and a second principal plane at principal point P' of the first cross-section, and K is the power of the first cross-section.

18. The method of claim 14, wherein the bulb comprises outer radius of curvature $r_1$ and inner radius of curvature $r_2$ of the second cross-section that satisfy the equations $$r_1 \approx -\frac{3d}{2} + \frac{d(n-1)}{n} + \frac{3R_1}{n-1} + \frac{(n-1)(d-R_1)^2 R_1^2}{\left(d^2(n-1)^2 + 4nR_1^2\right)^{3/2}} + \frac{d^2(n-1)^2 + 2dnR_1 + 2nR_1^2}{\sqrt[n]{d^2(n-1)^2 + 4nR_1^2}} - \frac{\sqrt[3]{d^2(n-1)^2 + 4nR_1^2}}{2(n-1)} \text{ and } r_2 = r_1 - d,$$

where d is thickness of wall of the bulb at the transverse axis, n is the refractive index of the bulb, and $R_1$ is outer radius of curvature and $R_2$ is inner radius of curvature of the first cross-section.

19. The method of claim 14, wherein the radiation from the laser is infrared.

20. The method of claim 14, wherein the bulb comprises at least one electrode and the longitudinal axis is an electrode axis.

* * * * *